(12) United States Patent
Harkness

(10) Patent No.: US 8,647,964 B2
(45) Date of Patent: Feb. 11, 2014

(54) TEMPORARY WAFER BONDING METHOD FOR SEMICONDUCTOR PROCESSING

(75) Inventor: Brian Harkness, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 13/583,007

(22) PCT Filed: Dec. 15, 2010

(86) PCT No.: PCT/US2010/060416
§ 371 (c)(1),
(2), (4) Date: Sep. 6, 2012

(87) PCT Pub. No.: WO2011/100030
PCT Pub. Date: Aug. 18, 2011

(65) Prior Publication Data
US 2013/0023109 A1    Jan. 24, 2013

Related U.S. Application Data

(60) Provisional application No. 61/303,822, filed on Feb. 12, 2010.

(51) Int. Cl.
 *H01L 21/30* (2006.01)
(52) U.S. Cl.
 USPC ........... 438/458; 438/106; 438/111; 438/118; 438/455; 438/462; 257/E21.122
(58) Field of Classification Search
 None
 See application file for complete search history.

(56) References Cited

U.S. PATENT DOCUMENTS

| 2,676,182 | A | 4/1954 | Daudt et al. |
| 3,159,601 | A | 12/1964 | Ashby et al. |
| 3,220,972 | A | 11/1965 | Lamoreaux et al. |
| 3,296,291 | A | 1/1967 | Chalk et al. |
| 3,419,593 | A | 12/1968 | Willing |
| 3,516,946 | A | 6/1970 | Modic |
| 3,814,730 | A | 6/1974 | Karstedt et al. |
| 3,989,668 | A | 11/1976 | Lee et al. |
| 4,087,585 | A | 5/1978 | Schulz et al. |
| 4,584,355 | A | 4/1986 | Blizzard et al. |
| 4,585,836 | A | 4/1986 | Homan et al. |

(Continued)

FOREIGN PATENT DOCUMENTS

| EP | 0493791 | A1 | 12/1991 |
| EP | 0347895 | B1 | 11/1993 |
| EP | 0497349 | B1 | 12/1996 |

OTHER PUBLICATIONS

JP 2009-120743, published Jun. 4, 2009. Abstract only.

(Continued)

*Primary Examiner* — Kyoung Lee
(74) *Attorney, Agent, or Firm* — Dow Corning Corporation; Claude F. Purchase; Erika Takeuchi

(57) ABSTRACT

A method for temporary wafer bonding employs a curable adhesive composition and a degradation agent combined with the curable adhesive composition. The adhesive composition may include (A) a polyorganosiloxane containing an average of at least two silicon-bonded unsaturated organic groups per molecule, (B) an organosilicon compound containing an average of at least two silicon-bonded hydrogen atoms per molecule in an amount sufficient to cure the composition, (C) a catalytic amount of a hydrosilylation catalyst, and (D) a base. The film prepared by curing the composition is degradable and removable by heating.

19 Claims, 8 Drawing Sheets

(56) References Cited

U.S. PATENT DOCUMENTS

| | | |
|---|---|---|
| 4,591,622 A | 5/1986 | Blizzard et al. |
| 4,625,011 A | 11/1986 | Kosal et al. |
| 4,766,176 A | 8/1988 | Lee et al. |
| 4,784,879 A | 11/1988 | Lee et al. |
| 5,017,654 A | 5/1991 | Togashi et al. |
| 5,036,117 A | 7/1991 | Chung et al. |
| 5,175,325 A | 12/1992 | Brown et al. |
| 5,194,649 A | 3/1993 | Okawa |
| 5,248,715 A | 9/1993 | Gray et al. |
| 5,744,507 A | 4/1998 | Angell et al. |
| 6,169,142 B1 | 1/2001 | Nakano et al. |
| 6,262,289 B1 | 7/2001 | Ouchi |
| 6,349,312 B1 | 2/2002 | Fresko et al. |
| 6,617,674 B2 | 9/2003 | Becker et al. |
| 6,907,176 B2 | 6/2005 | Gardner et al. |
| 7,935,780 B2 * | 5/2011 | Hong et al. .................. 528/350 |
| 2007/0160936 A1 | 7/2007 | Gardner et al. |
| 2008/0090380 A1 | 4/2008 | Gardner et al. |
| 2008/0271845 A1 | 11/2008 | Keite-Telgenbuscher et al. |
| 2010/0179289 A1 | 7/2010 | Hupfield et al. |
| 2011/0069467 A1 | 3/2011 | Flaim et al. |
| 2011/0263095 A1 | 10/2011 | Takeuchi et al. |

OTHER PUBLICATIONS

Puligadda, Rama, et. al. "High-Performance Temporary Adhesives for Wafer Bonding Applications", Materials Research Society, Symp. Proc., vol. 970, 2007.

Milasincic, Chris, "DuPont Wafer Level Packaging: Materials Characterization for Thin Wafer Processing", HD MicroSystems presentation, Jul. 13, 2009.

\* cited by examiner

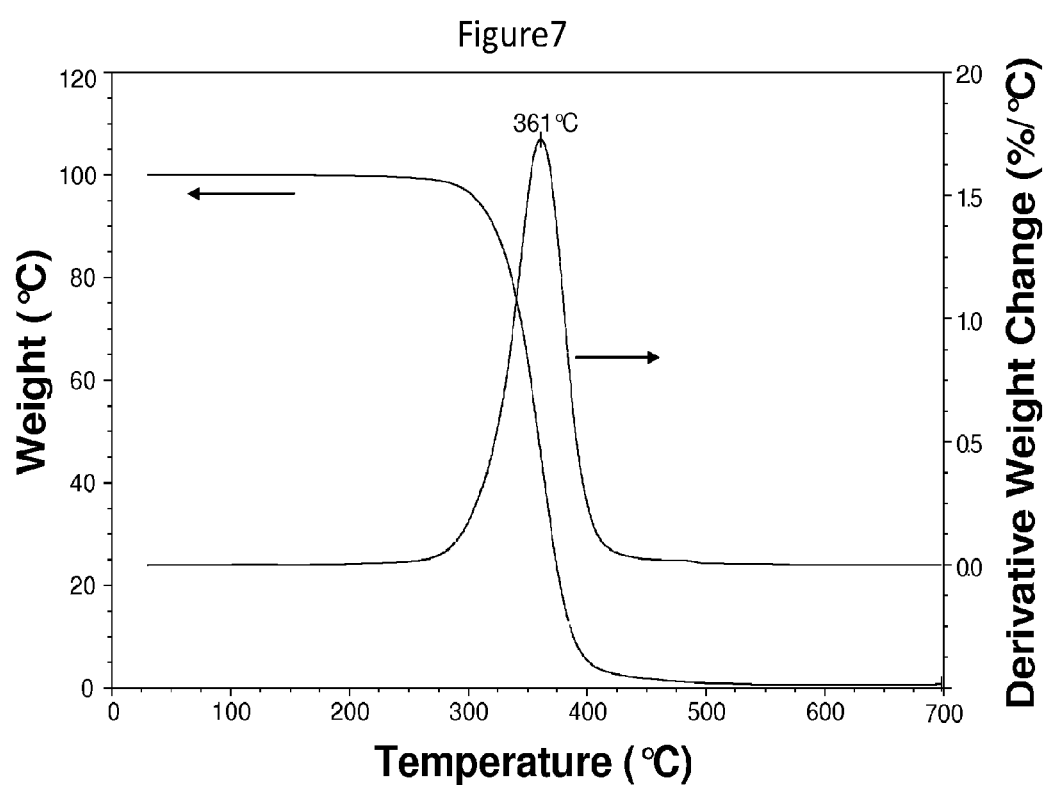

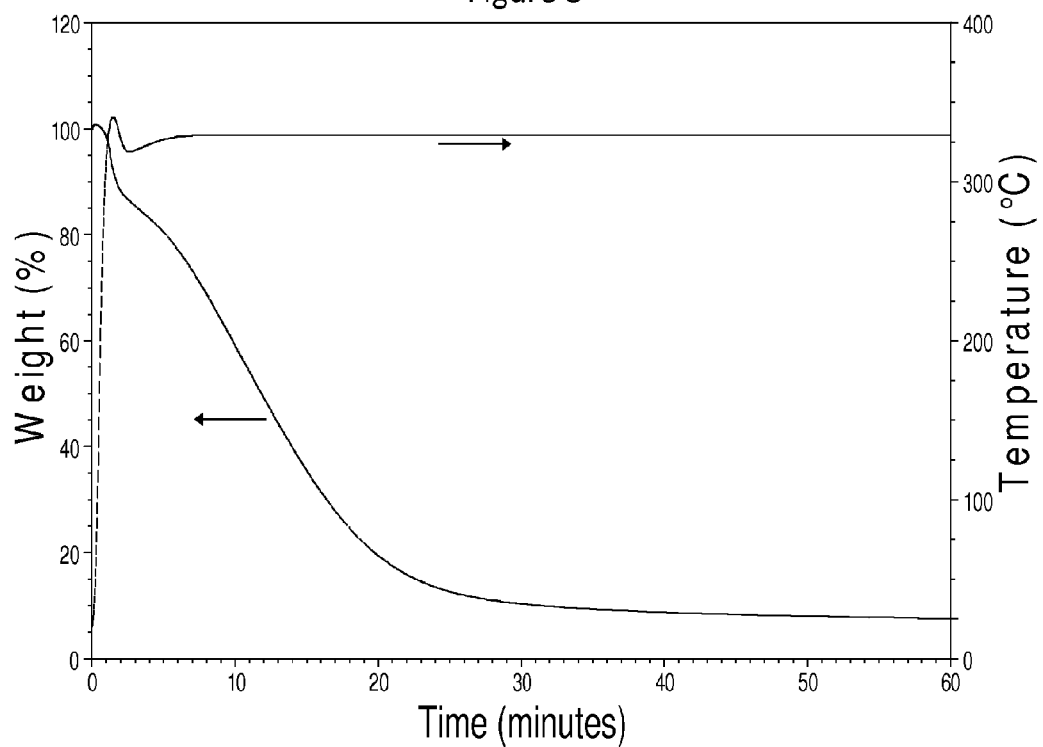

TEMPORARY WAFER BONDING METHOD FOR SEMICONDUCTOR PROCESSING

CROSS REFERENCE TO RELATED APPLICATIONS

This application is a U.S. national stage filing under 35 U.S.C. §371 of PCT Application No. PCT/US10/060416 filed on 15/DEC/2010, currently pending, which claims the benefit of U.S. Provisional Patent Application No. 61/303,822 filed 12/FEB/2010 under 35 U.S.C. §119 (e). PCT Application No. PCT/US10/060416 and U.S. Provisional Patent Application No. 61/303,822 are hereby incorporated by reference.

BACKGROUND

1. Technical Field

This invention relates to a method for bonding a wafer to a substrate using a curable adhesive composition. A method for removing the adhesive is disclosed.

2. Background

As market pressures drive manufacturers toward thinner die packages, one method for reducing the overall height of the package has been thinning of the silicon die. The thinning operation is most efficiently performed on the silicon wafer prior to die singulation. However, as wafers get larger and the dice get thinner, the overall structural integrity of the wafer is reduced. As a result, the large, thin wafers may break when processed using existing equipment and materials.

One proposed solution to this problem is to adhesively bind the wafer to a reinforcing substrate (such as another wafer or a wafer carrier) to increase mechanical strength, perform the desired processing, e.g., thinning, and release the wafer before singulation. The adhesive and substrate in this process act as a mechanical support to provide the structural stability during processing.

There is a need in the semiconductor industry for a temporary wafer bonding process using an adhesive having properties to allow for processing the wafer. The adhesive should be capable of being applied by an industrially acceptable method (such as spray coating, printing, dipping, or spin coating), should be capable of withstanding processing at temperatures above 200° C. for several hours, should be robust to various commonly used electronic chemicals, and should release cleanly from the wafer on command.

SUMMARY OF THE INVENTION

This invention relates to a wafer processing method. The method comprises:

(1) forming a film on a first substrate, where the film comprises:
  (I) a curable adhesive composition, and
  (II) a degradation agent;
(3) applying a second substrate to the film, where at least one of the first substrate and the second substrate is a semiconductor wafer,
(4) curing the film to form a cured film,
(5) processing the semiconductor wafer,
(6) degrading the cured film by heating, and
(8) separating the first substrate and the second substrate.

BRIEF DESCRIPTION OF THE DRAWINGS

FIG. 7 is a thermal decomposition (TGA) profile for the experimental radically cured adhesive containing 103 ppm potassium t-butoxide (heating rate 5° C./minute under nitrogen atmosphere) in Example 6, below.

FIG. 8 is an isothermal 329° C. TGA decomposition profile of example 1 sample 1a (Q1-4010 adhesive containing 104 ppm of potassium t-butoxide) for 1 hour under a nitrogen atmosphere. Most of the thermal decomposition and volatilization of the sample occurred within 30 minutes of heating.

DETAILED DESCRIPTION OF THE INVENTION

Figure 1:
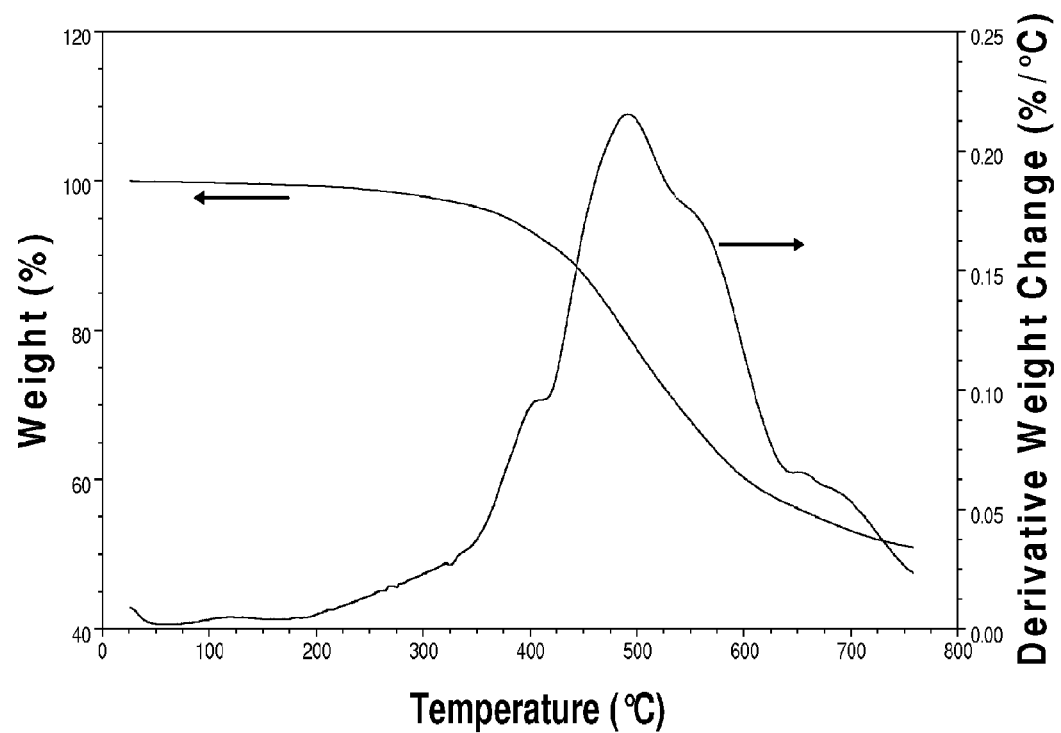
FIG. 1 is a thermal decomposition (TGA) profile for Q1-4010 adhesive containing no potassium t-butoxide (heating rate 5° C./minute under nitrogen atmosphere) in Example 1, below. For Thermal Gravitational Analysis (TGA), samples were placed into a Pt pan and heated under nitrogen at a rate of 5° C./minute to the upper temperature limit using a TA Instruments Q500 V6.7 Build 203 TGA.

All amounts, ratios, and percentages are by weight unless otherwise indicated.

Component (I) Adhesive Composition

The adhesive composition for use in the method of this invention may be any adhesive composition that does not evolve substantial by-products from its curing reaction. The adhesive composition may be an addition reaction curable adhesive composition or a radical curable adhesive composition or an epoxy curable composition. Curable adhesive compositions include, but are not limited to, acrylate curable, epoxy curable, hydrosilylation curable, and methacrylate curable. The curable adhesive composition may be a curable silicone adhesive composition. A hydrosilylation curable adhesive composition suitable for use in this method comprises:

(A) a polyorganosiloxane containing an average of at least two silicon-bonded unsaturated organic groups per molecule, (B) an organosilicon compound containing an average of at least two silicon-bonded hydrogen atoms per molecule in an amount sufficient to cure the composition, and (C) a hydrosilylation catalyst.

Component (A) Polyorganosiloxane

Component (A) comprises at least one polyorganosiloxane containing an average of at least two silicon-bonded unsaturated organic groups per molecule. These unsaturated organic groups are capable of undergoing a hydrosilylation reaction and are exemplified by alkenyl groups. The polyorganosiloxane may be a mixture of molecules that have a linear, branched, or resinous structure. Alternatively, the polyorganosiloxane may be a mixture of molecules that have a linear or branched structure. Alternatively, the polyorganosiloxane may have a linear structure. Alternatively, the adhesive composition may be resinless. For purposes of this application, the term 'resinless' means the curable silicone adhesive composition contains polyorganosiloxane components with an amount of T and/or Q units that is insufficient to render the adhesive prepared by curing the composition solid or liquid after step (6), (7), (8), or (9) in the method described below. Alternatively, resinless includes a curable adhesive composition containing 0% to 3 weight % of T and Q units in the polyorganosiloxane components of the composition based on the number of the Si—O units in the polyorganosiloxane components, alternatively 0% of the polyorganosiloxane components of the composition, alternatively 0.01 to 3 weight % of the polyorganosiloxane components of the composition. Without wishing to be bound by theory, it is thought that when too much of a resin with T or Q units is present in the curable adhesive composition, there will be a reequilibration process in the presence of a base degradation agent, and this can form a resin which is not sufficiently degradable to gaseous by-products to allow for adequate removal of adhesive residue from the wafer. Therefore, too much resin in a silicone adhesive is detrimental to the process because the degradation product may be a liquid or solid, which may leave a residue on the substrates used in the method described herein. The polyorganosiloxane may be a homopolymer or a copolymer. The unsaturated organic groups may have 2 to 10 carbon atoms, the number of carbon atoms including each and all integers between 2 and 10, and are exemplified by, but not limited to, alkenyl groups such as vinyl, allyl, butenyl, and hexenyl. The unsaturated organic groups in the polyorganosiloxane may be located at terminal, pendant, or both terminal and pendant positions.

The remaining silicon-bonded organic groups in the polyorganosiloxane are organic groups free of aliphatic unsaturation. These organic groups may be independently selected from monovalent hydrocarbon and monovalent halogenated hydrocarbon groups free of aliphatic unsaturation. These monovalent groups may have from 1 to 20 carbon atoms, the number of carbon atoms including each and all integers between 1 and 20, alternatively 1 to 10 carbon atoms, and are exemplified by, but not limited to alkyl such as methyl, ethyl, propyl, pentyl, octyl, undecyl, and octadecyl; cycloalkyl such as cyclohexyl; aryl such as phenyl, tolyl, xylyl, benzyl, and 2-phenylethyl; and halogenated hydrocarbon groups such as 3,3,3-trifluoropropyl, 3-chloropropyl, and dichlorophenyl. At least 50 mol %, alternatively at least 80 mol %, of the organic groups free of aliphatic unsaturation in the polyorganosiloxane may be methyl.

The viscosity of the polyorganosiloxane at 25° C. varies with molecular weight and structure, but may be 0.001 to 100,000 Pascal·seconds (Pa·s), alternatively 0.01 to 10,000 Pa·s, and alternatively 0.01 to 1,000 Pa·s. Viscosity was measured by ASTM D 1084 at a temperature of 25° C.

Examples of polyorganosiloxanes useful in the hydrosilylation curable adhesive composition include, but are not limited to, polydiorganosiloxanes having the following formulae:

$ViMe_2SiO(Me_2SiO)_aSiMe_2Vi$, $ViMe_2SiO(Me_2SiO)_{0.25a}(MePhSiO)_{0.75a}SiMe_2Vi$, $ViMe_2SiO(Me_2SiO)_{0.95a}(Ph_2SiO)_{0.05a}SiMe_2Vi$, $ViMe_2SiO(Me_2SiO)_{0.98a}(MeViSiO)_{0.02a}SiMe_2Vi$, $Me_3SiO(Me_2SiO)_{0.95a}(MeViSiO)_{0.05a}SiMe_3$, and $PhMeViSiO(Me_2SiO)_aSiPhMeVi$, where Me, Vi, and Ph denote methyl, vinyl, and phenyl respectively and subscript a has a value such that the viscosity of the polydiorganosiloxane is 0.001 to 100,000 Pa·s, and when subscript a has a numerical value in front of the a, this means that the value of a is multiplied by the numerical value.

Methods of preparing polyorganosiloxanes suitable for use in the adhesive composition, such as hydrolysis and condensation of the corresponding organohalosilanes or equilibration of cyclic polydiorganosiloxanes, are known in the art.

In certain embodiments, such as when solvent and/or etching solution may be used in the method described below, a resin may be present in the composition. Examples of polyorganosiloxane resins which may be present in the hydrosilylation curable adhesive composition include an MQ resin consisting essentially of $R^1_3SiO_{1/2}$ (M) units and $SiO_{4/2}$ (Q) units, a TD resin consisting essentially of $R^1SiO_{3/2}$ (T) units and $R^1_2SiO_{2/2}$ (D) units, an MT resin consisting essentially of $R^1_3SiO_{1/2}$ units and $R^1SiO_{3/2}$ units, and an MTD resin consisting essentially of $R^1_3SiO_{1/2}$ units, $R^1SiO_{3/2}$ units, and $R^1_2SiO_{2/2}$ units, wherein each $R^1$ is independently selected from monovalent hydrocarbon and monovalent halogenated hydrocarbon groups. The monovalent groups represented by $R^1$ may have 1 to 20 carbon atoms, the number of carbon atoms including each and all integers between 1 and 20, alternatively 1 to 10 carbon atoms.

Examples of monovalent groups for $R^1$ include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; aryl such as phenyl, tolyl, xylyl, benzyl, and 2-phenylethyl; and halogenated hydrocarbon groups such as 3,3,3-trifluoropropyl, 3-chloropropyl, and dichlorophenyl. Alternatively, at least one-third, and alternatively substantially all $R^1$ groups in the polyorganosiloxane resin may be methyl. An exemplary polyorganosiloxane resin consists essentially of $(CH_3)_3SiO_{1/2}$ siloxane units and $SiO_{4/2}$ where the mole ratio of $(CH_3)_3SiO_{1/2}$ units to $SiO_{4/2}$ units ranges from 0.6 to 1.9.

The polyorganosiloxane resin may contain an average of 3 to 30 mole percent of unsaturated organic groups capable of undergoing a hydrosilylation reaction, such as alkenyl groups. The mole percent of unsaturated organic groups in the resin is the ratio of the number of moles of unsaturated organic group-containing siloxane units in the resin to the total number of moles of siloxane units in the resin, multiplied by 100.

The polyorganosiloxane resin may be prepared by methods known in the art. For example, the polyorganosiloxane resin may prepared by treating a resin copolymer produced by the silica hydrosol capping process of Daudt, et al. with at least an alkenyl-containing endblocking reagent. The method of Daudt, et al. is disclosed in U.S. Pat. No. 2,676,182.

Briefly stated, the method of Daudt, et al. involves reacting a silica hydrosol under acidic conditions with a hydrolyzable triorganosilane such as trimethylchlorosilane, a siloxane such as hexamethyldisiloxane, or a combination thereof, and recovering a copolymer having M and Q units. The resulting copolymers may contain 2 to 5 percent by weight of hydroxyl groups.

The polyorganosiloxane resin, which may contain less than 2 percent by weight of silicon-bonded hydroxyl groups, may be prepared by reacting the product of Daudt, et al. with an alkenyl-containing endblocking agent or a mixture of an alkenyl-containing endblocking agent and an endblocking agent free of aliphatic unsaturation in an amount sufficient to provide 3 to 30 mole percent of alkenyl groups in the final product. Examples of endblocking agents include, but are not limited to, silazanes, siloxanes, and silanes. Suitable endblocking agents are known in the art and are exemplified in U.S. Pat. Nos. 4,584,355; 4,591,622; and 4,585,836. A single endblocking agent or a mixture of endblocking agents may be used to prepare the polyorganosiloxane resin.

Component (A) may be a single polyorganosiloxane or a combination comprising two or more polyorganosiloxanes that differ in at least one of the following properties: structure, viscosity, average molecular weight, siloxane units, and sequence. The exact amount of component (A) that may be added to the hydrosilylation curable adhesive composition depends on various factors including the type of components (A) and (B) and the amount of component (B) in the hydrosilylation curable adhesive composition and the ratio of silicon bonded hydrogen atoms to unsaturated organic groups capable of undergoing a hydrosilylation reaction in components (SiH:vinyl ratio) of the hydrosilylation curable adhesive composition. However, the amount of component (A) may range from 20% to 95% based on the weight of the hydrosilylation curable adhesive composition.

Component (B) Organosilicon Compound

Component (B) in the hydrosilylation curable adhesive composition is at least one organosilicon compound containing an average of at least two silicon-bonded hydrogen atoms per molecule. It is generally understood that crosslinking occurs when the sum of the average number of alkenyl groups per molecule in component (A) and the average number of silicon-bonded hydrogen atoms per molecule in component (B) is greater than four. The silicon-bonded hydrogen atoms in the component (B) may be located at terminal, pendant, or at both terminal and pendant positions.

The organosilicon compound may be an organosilane or an organohydrogensiloxane. The organosilane may be a monosilane, disilane, trisilane, or polysilane. Similarly, the organohydrogensiloxane may be a disiloxane, trisiloxane, or polysiloxane. The organosilicon compound may be an organohydrogensiloxane or the organosilicon compound may be an organohydrogenpolysiloxane. The structure of the organosilicon compound may be linear, branched, cyclic, or resinous. At least 50 percent of the organic groups in the organosilicon compound may be methyl.

Examples of organosilanes include, but are not limited to, monosilanes such as diphenylsilane and 2-chloroethylsilane; disilanes such as 1,4-bis(dimethylsilyl)benzene, bis[(p-dimethylsilyl)phenyl]ether, and 1,4-dimethyldisilylethane; trisilanes such as 1,3,5-tris(dimethylsilyl)benzene and 1,3,5-trimethyl-1,3,5-trisilane; and polysilanes such as poly(methylsilylene)phenylene and poly(methylsilylene)methylene.

Examples of organohydrogensiloxanes include, but are not limited to, disiloxanes such as 1,1,3,3-tetramethyldisiloxane and 1,1,3,3-tetraphenyldisiloxane; trisiloxanes such as phenyltris(dimethylsiloxy)silane and 1,3,5-trimethylcyclotrisiloxane; and polysiloxanes such as a trimethylsiloxy-terminated poly(methylhydrogensiloxane), a trimethylsiloxy-terminated poly(dimethylsiloxane/methylhydrogensiloxane), a dimethylhydrogensiloxy-terminated poly(methylhydrogensiloxane), and a resin consisting essentially of $H(CH_3)_2SiO_{1/2}$ units, $(CH_3)_3SiO_{1/2}$ units, and $SiO_{4/2}$ units.

Component (B) may be a single organosilicon compound or a combination comprising two or more such compounds that differ in at least one of the following properties: structure, average molecular weight, viscosity, silane units, siloxane units, and sequence.

The amount of component (B) in the adhesive composition of the present invention is sufficient to cure the composition. The exact amount of component (B) depends on the desired extent of cure, which generally increases as the SiH:vinyl ratio increases. The amount of component (B) may be sufficient to provide from 0.5 to 3 silicon-bonded hydrogen atoms per unsaturated organic group capable of undergoing hydrosilylation reaction in component (A). Alternatively, the concentration of component (B) is sufficient to provide 0.7 to 1.2 silicon-bonded hydrogen atoms per alkenyl group in component (A). However, the amount of component (B) may range from 1% to 80%, alternatively 2% to 10% based on the weight of the composition.

Methods of preparing organosilicon compounds containing silicon-bonded hydrogen atoms are known in the art. For example, organopolysilanes may be prepared by reaction of chlorosilanes in a hydrocarbon solvent in the presence of sodium or lithium metal (Wurtz reaction). Organopolysiloxanes may be prepared by hydrolysis and condensation of organohalosilanes.

To improve compatibility of components (A) and (B), the predominant organic group in each component may be the same. For example, this group may be methyl.

Component (C) Catalyst

Suitable hydrosilylation catalysts are known in the art and commercially available. Component (C) may comprise a platinum group metal selected from platinum, rhodium, ruthenium, palladium, osmium or iridium metal or organometallic compound thereof, or a combination thereof. Component (C) is exemplified by compounds such as chloroplatinic acid, chloroplatinic acid hexahydrate, platinum dichloride, platinum acetyl acetonate, and complexes of said compounds with low molecular weight organopolysiloxanes or platinum compounds microencapsulated in a matrix or coreshell type structure. Complexes of platinum with low molecular weight organopolysiloxanes include 1,3-diethenyl-1,1,3,3-tetramethyldisiloxane complexes with platinum. These complexes may be microencapsulated in a resin matrix.

Suitable hydrosilylation catalysts for component (C) are described in, for example, U.S. Pat. Nos. 3,159,601; 3,220,972; 3,296,291; 3,419,593; 3,516,946; 3,814,730; 3,989,668; 4,784,879; 5,036,117; and 5,175,325 and EP 0 347 895 B. Microencapsulated hydrosilylation catalysts and methods of preparing them are known in the art, as exemplified in U.S. Pat. No. 4,766,176 and the references cited therein; and U.S. Pat. No. 5,017,654.

The concentration of component (C) is sufficient to catalyze the hydrosilylation reaction of components (A) and (B) upon exposure to heat in the method described herein. The amount of component (C) may be from 0.1 to 1000 parts per million (ppm) of platinum group metal, alternatively from 0.5 to 100 ppm of platinum group metal, and alternatively from 1 to 25 ppm of platinum group metal, based on the combined weight of components (A), (B), and (C). The rate of cure may be slow below 1 ppm of platinum group metal. The use of more than 100 ppm of platinum group metal may be uneconomical or may reduce stability of the adhesive composition.

Suitable hydrosilylation curable adhesive compositions for use in the method described herein are commercially available. For example, DOW CORNING® Q1-4010 is a resin containing hydrosilylation curable adhesive composition, and DOW CORNING® 1-4105 is a resin containing hydrosilylation curable adhesive composition, both of which are commercially available from Dow Corning Corporation of Midland, Mich., USA. An exemplary resinless hydrosilylation curable adhesive composition may comprise an alkenyl-terminated polydiorganosiloxane, a triorganosiloxy-terminated poly(diorgano/organohydrogen)siloxane, and a platinum catalyst, such as a mixture of 1.5 parts 1,3-diethenyl-1,1,3,3-tetramethyldisiloxane complex with platinum in an alkenyl-terminated polydiorganosiloxane.

Component (II) Degradation Agent

A degradation agent is added to the curable adhesive composition used to form the film in the method described herein. The degradation agent may be a base or an acid. The base thermally renders the adhesive (prepared by curing the curable adhesive composition) thermally degradable. For example, the degradation agent may be a base added to a silicone adhesive composition, where the resulting film made from the combination of base and silicone adhesive composition cures to form a silicone adhesive that functions as an adhesive through the wafer bonding and processing methods, but at higher temperatures will decompose (revert) to cyclic polyorganosiloxanes and byproducts resulting in the "evaporation" of the silicone adhesive allowing clean removal of the processed wafer from the substrate, such as a carrier or another wafer. The byproducts may be gaseous.

The base may comprise an inorganic base such as ammonium hydroxide, cesium hydroxide, lithium tert-butoxide, potassium hydroxide, potassium butoxide, potassium silanolate, potassium tert-butoxide, sodium hydroxide; carbonates thereof, and a combination thereof. Alternatively, the base may comprise a metal alkoxide such as sodium methoxide, an aluminum alkoxide, a tin alkoxyide, a titanium alkoxide, a zinc alkoxide, a zirconium alkoxide; or a combination thereof. Examples of metal alkoxides are disclosed in U.S. Pat. No. 6,262,289 at col. 10 line 66 to col. 11, line 54. Alternatively, the base may comprise an organic base such as phosphazene; tetraalkyl ammonium hydroxides including tetramethyl ammonium hydroxide, tetraethyl ammonium hydroxide, tetrabutyl ammonium hydroxide and tetrapropylammonium hydroxide; and a combination thereof. Carbonates of the bases described above may be prepared by bubbling carbon dioxide through the curable adhesive composition with the strong base added thereto. Use of carbonates may render the composition more stable and improve shelf life of the curable adhesive composition. The amount of base in the curable silicone adhesive composition may range from 10 parts per million (ppm) to 200 ppm, alternatively 25 to 150 ppm based on the weight of the curable silicone adhesive composition.

Alternatively, the degradation agent may comprise a phosphazene base, such as tert-butyl phosphazene. Alternatively, the degradation agent may comprise an acid. The acid may be a carborane acid. Examples of suitable phosphazene bases and carborane acids are disclosed in WO 2008/157080 at paragraphs [0014]-[0016] and [0017]-[0019], respectively.

Optional Components

The film described in the method herein may further comprise one or more optional components, provided the optional component does not adversely affect cure of the adhesive composition in the method of this invention. Examples of optional components include, but are not limited to, (III) a solvent, (IV) an inhibitor, (V) a filler, (VI) a treating agent, (VII) a spacer, (VIII) an adhesion promoter, (IX) a surfactant, (X) a colorant such as a pigment or dye, (XI) an optical brightener and a combination thereof.

Component (III) Solvent

The film may optionally further comprise a solvent. Suitable solvents are known in the art and are commercially available. The solvent may be an organic solvent having from 3 to 20 carbon atoms. Examples of solvents include aliphatic hydrocarbons, such as nonane, decalin, and dodecane; aromatic hydrocarbons, such as mesitylene, xylene, and toluene; esters, such as ethyl acetate and γ-butyrolactone; ethers, such as n-butyl ether and polyethylene glycol monomethylether; ketones, such as methyl isobutyl ketone and methyl pentyl ketone; tetrahydrofuran; silicone fluids such as linear, branched, and cyclic polydimethylsiloxanes and combinations of such solvents. The optimum concentration of a particular solvent in an adhesive composition can be readily determined by routine experimentation. However, the amount of solvent may be 0% to 95% based on the weight of the composition, alternatively 1% to 95%.

Component (IV) Inhibitor

Combinations of components (A), (B), and (C) may begin to cure at ambient temperature. To obtain a longer working time or "pot life", the activity of the catalyst under ambient conditions may be retarded or suppressed by the addition of optional component (IV), an inhibitor to the curable adhesive composition. An inhibitor retards curing of the present adhesive composition at ambient temperature, but does not prevent the composition from curing at elevated temperatures. Suitable inhibitors for hydrosilylation curable adhesive compositions include various "ene-yne" systems such as 3-methyl-3-penten-1-yne and 3,5-dimethyl-3-hexen-1-yne; acetylenic alcohols such as 3,5-dimethyl-1-hexyn-3-ol, 1-ethynyl-1-cyclohexanol, and 2-phenyl-3-butyn-2-ol; maleates and fumarates, such as the well known dialkyl, dialkenyl, and dialkoxyalkyl fumarates and maleates; and cyclovinylsiloxanes.

The amount of inhibitor in the adhesive composition is sufficient to retard curing of the composition at ambient temperature without preventing or excessively prolonging cure at elevated temperatures. This amount will vary depending on the particular inhibitor used, the nature and amount of component (C), and the nature of the component (B). However, in hydrosilylation curable adhesive compositions, inhibitor concentrations as low as one mole of inhibitor per mole of platinum group metal may yield a satisfactory storage stability and cure rate. Inhibitor concentrations of up to 500 or more moles of inhibitor per mole of platinum group metal may be used. One skilled in the art would be able to determine the optimum concentration for a particular inhibitor in a particular adhesive composition by routine experimentation.

Component (V) Filler

Optional component (V) is a filler. Component (V) may comprise a thermally conductive filler, a reinforcing filler, or a combination thereof. Suitable thermally conductive fillers for component (V) include metal particles, metal oxide particles, and a combination thereof. Suitable thermally conductive fillers for component (V) are exemplified by aluminum nitride; aluminum oxide; barium titanate; beryllium oxide; boron nitride; diamond; graphite; magnesium oxide; metal particulate such as copper, gold, nickel, or silver; silicon carbide; tungsten carbide; zinc oxide, and a combination thereof.

Thermally conductive fillers are known in the art and commercially available, see for example, U.S. Pat. No. 6,169,142 (col. 4, lines 7-33). For example, CB-A20S and A1-43-Me are aluminum oxide fillers of differing particle sizes commercially available from Showa-Denko, and AA-04, AA-2, and AA18 are aluminum oxide fillers commercially available from Sumitomo Chemical Company. Silver filler is commercially available from Metalor Technologies U.S.A. Corp. of Attleboro, Mass., U.S.A. Boron nitride filler is commercially available from Advanced Ceramics Corporation, Cleveland, Ohio, U.S.A.

Reinforcing fillers include silica, and chopped fiber, such as chopped KEVLAR®.

A combination of fillers having differing particle sizes and different particle size distributions may be used as component (V).

Component (VI) Treating Agent

The filler may optionally be surface treated with component (VI), a treating agent. Treating agents and treating methods are known in the art, see for example, U.S. Pat. No. 6,169,142 (col. 4, line 42 to col. 5, line 2).

The treating agent may be an alkoxysilane having the formula: $R^3_c Si(OR^4)_{(4-c)}$, where c is 1, 2, or 3; alternatively c is 3. $R^3$ is a substituted or unsubstituted monovalent hydrocarbon group of 1 to 50 carbon atoms, the number of carbon atoms including each and all integers between 1 and 50, alternatively 8 to 30 carbon atoms, alternatively 1 to 18 carbon atoms. $R^3$ is exemplified by alkyl groups such as hexyl, octyl, dodecyl, tetradecyl, hexadecyl, and octadecyl; and aromatic groups such as benzyl, phenyl and phenylethyl. $R^3$ may be saturated or unsaturated, branched or unbranched, and unsubstituted. Alternatively, $R^3$ may be saturated, unbranched, and unsubstituted.

$R^4$ is an unsubstituted, saturated hydrocarbon group of at least 1 carbon atom. $R^4$ may have 1 to 4 carbon atoms, alternatively 1 to 2 carbon atoms.

Component (VI) is exemplified by hexyltrimethoxysilane, octyltriethoxysilane, decyltrimethoxysilane, dodecyltrimethyoxysilane, tetradecyltrimethoxysilane, phenyltrimethoxysilane, octadecyltrimethoxysilane, octadecyltriethoxysilane, and a combination thereof.

Alkoxy-functional oligosiloxanes may also be used as component (VI). Alkoxy-functional oligosiloxanes and methods for their preparation are known in the art, see for example, EP 1 101 167 A2. For example, suitable alkoxy-functional oligosiloxanes include those of the formula $(R^7O)_d Si(OSiR^5_2 R^6)_{4-d}$. In this formula, d is 1, 2, or 3, alternatively d is 3. Each $R^5$ is may be independently selected from saturated and unsaturated monovalent hydrocarbon groups of 1 to 10 carbon atoms, the number of carbon atoms including each and all integers between 1 and 10. Each $R^6$ may be a saturated or unsaturated monovalent hydrocarbon group having at least 11 carbon atoms. Each $R^7$ may be an alkyl group.

Metal fillers may be treated with alkylthiols such as octadecyl mercaptan, and fatty acids such as oleic acid, stearic acid, titanates, titanate coupling agents, zirconate coupling agents, and a combination thereof.

Treating agents for alumina or passivated aluminum nitride could include alkoxysilyl functional alkylmethyl polysiloxanes (e.g., partial hydrolysis condensate of $R^8_e R^9_f Si(OR^{10})_{(4-e-f)}$ or cohydrolysis condensates or mixtures), similar materials where the hydrolyzable group would be silazane, acyloxy or oximo. In all of these, a group tethered to Si, such as $R^8$ in the formula above, is an unsaturated monovalent hydrocarbon or monovalent aromatic-functional hydrocarbon. $R^9$ is a monovalent hydrocarbon group, and $R^{10}$ is a monovalent hydrocarbon group of 1 to 4 carbon atoms. In the formula above, e is 1, 2, or 3 and f is 0, 1, or 2, with the proviso that e+f is 1, 2, or 3. One skilled in the art could optimize a specific treating agent to aid dispersion of the filler by routine experimentation.

Component (VIII) Spacer

Optional component (VIII) is a spacer. Spacers may comprise organic particles, inorganic particles, or a combination thereof. Spacers may be thermally conductive, electrically conductive, or both. Spacers have a particle size depending on various factors including how far apart it is desired to have the wafer and substrate, however, spacers may have a particle size ranging from 25 to 250 micrometers. Spacers may comprise monodisperse beads. Spacers are exemplified by, but not limited to, polystyrene, glass, perfluorinated hydrocarbon polymers, and a combination thereof. Spacers may be added in addition to, or instead of, all or a portion of the filler. Spacers may be treated with component (VI).

Component (VIII) Adhesion Promoter

Component (VIII) is an adhesion promoter. Component (VIII) may comprise a transition metal chelate, an alkoxysilane, a combination of an alkoxysilane and a hydroxy-functional polyorganosiloxane, or a combination thereof.

Component (VIII) may be an unsaturated or epoxy-functional compound. Suitable epoxy-functional compounds are known in the art and commercially available, see for example, U.S. Pat. Nos. 4,087,585; 5,194,649; 5,248,715; and 5,744,507 col. 4-5. Component (VIII) may comprise an unsaturated or epoxy-functional alkoxysilane. For example, the functional alkoxysilane may have the formula $R^{11}_g Si(OR^{12})_{(4-g)}$, where g is 1, 2, or 3, alternatively g is 1.

Each $R^{11}$ is independently a monovalent organic group with the proviso that at least one $R^{11}$ is an unsaturated organic group or an epoxy-functional organic group. Epoxy-functional organic groups for $R^{11}$ are exemplified by 3-glycidoxypropyl and (epoxycyclohexyl)ethyl. Unsaturated organic groups for $R^{11}$ are exemplified by 3-methacryloyloxypropyl, 3-acryloyloxypropyl, and unsaturated monovalent hydrocarbon groups such as vinyl, allyl, hexenyl, undecylenyl.

Each $R^{12}$ is independently a saturated hydrocarbon group of 1 to 4 carbon atoms, alternatively 1 to 2 carbon atoms. $R^{12}$ is exemplified by methyl, ethyl, propyl, and butyl.

Examples of suitable epoxy-functional alkoxysilanes include 3-glycidoxypropyltrimethoxysilane, 3-glycidoxypropyltriethoxysilane, (epoxycyclohexyl)ethyldimethoxysilane, (epoxycyclohexyl)ethyldiethoxysilane and a combination thereof. Examples of suitable unsaturated alkoxysilanes include vinyltrimethoxysilane, allyltrimethoxysilane, allyltriethoxysilane, hexenyltrimethoxysilane, undecylenyltrimethoxysilane, 3-methacryloyloxypropyl trimethoxysilane, 3-methacryloyloxypropyl triethoxysilane, 3-acryloyloxypropyl trimethoxysilane, 3-acryloyloxypropyl triethoxysilane, and a combination thereof.

Component (VIII) may comprise an epoxy-functional siloxane such as a reaction product of a hydroxy-terminated polyorganosiloxane with an epoxy-functional alkoxysilane, as described above, or a physical blend of the hydroxy-terminated polyorganosiloxane with the epoxy-functional alkoxysilane, for example a mixture of glycidoxypropyltrimethoxysilane and hydroxy-terminated methylvinylsiloxane may be used as the adhesion promoter. Component (VIII) may comprise a combination of an epoxy-functional alkoxysilane and an epoxy-functional siloxane. For example, component (VIII) is exemplified by a mixture of 3-glycidoxypropyltrimethoxysilane and a reaction product of hydroxy-terminated methylvinylsiloxane with 3-glycidoxypropyltrimethoxysilane, or a mixture of 3-glycidoxypropyltrimethoxysilane and a hydroxy-terminated methylvinylsiloxane, or a mixture of 3-glycidoxypropyltrimethoxysilane and a hydroxy-terminated methylvinyl/dimethylsiloxane copolymer. When used as a physical blend rather than as a reaction product, these components may be stored separately in multiple-part kits.

Suitable transition metal chelates include titanates, zirconates such as zirconium acetylacetonate, aluminum chelates such as aluminum acetylacetonate, and a combination thereof. Transition metal chelates and methods for their preparation are known in the art, see for example, U.S. Pat. No. 5,248,715, EP 0 493 791 A1, and EP 0 497 349 B1.

Component (XI) Optical Brightener

Component (XI) is an optical brightener. Suitable optical brighteners are known in the art and are commercially available. For example, (thiophenediyl)bis(t-butylbenzoxazole) is commercially available as Ciba® TINOPAL® OB from BASF Corporation of Florham Park, N.J., USA.

The hydrosilylation curable adhesive composition may be a one-part composition comprising components (A), (B), (C), and inhibitor in a single part or, alternatively, a multi-part composition comprising components (A) through (C) in two or more parts. In a multi-part composition, components (A), (B), and (C) are typically not present in the same part unless an inhibitor is also present. A multi-part adhesive composition may comprise a first part containing a portion of component (A) and all of component (B) and a second part containing the remaining portion of component (A) and all of component (C).

The one-part hydrosilylation curable adhesive composition may be prepared by combining components (A) through (C) and any optional components in the stated amounts at ambient temperature with or without the aid of a solvent, which is described above. Although the order of addition of the various components is not critical if the silicone composition is to be used immediately, the hydrosilylation catalyst may be added last at a temperature below about 30° C. to prevent premature curing of the composition. Also, the multi-part silicone composition of the present invention can be prepared by combining the particular components designated for each part.

Radical Curable Composition

Alternatively, a radical curable silicone adhesive composition may be used in the method described herein as the curable adhesive composition in step (I). A suitable radical curable adhesive composition useful in the present method comprises:

(a) a polyorganosiloxane containing an average of at least two radical curable organic groups per molecule, and
(b) a radical initiator.

Component (a) comprises at least one polyorganosiloxane containing an average of at least two radical curable organic groups per molecule. These radical curable organic groups are capable of undergoing a radical curing reaction and are exemplified by acrylate-functional organic groups, or methacrylate functional organic groups, or aliphatically unsaturated hydrocarbon groups such as alkenyl. Component (a) in the radical curable adhesive composition may be the same as component (A) described above in the hydrosilylation curable composition. The polyorganosiloxane for component (a) may have a linear or branched structure. The polyorganosiloxane may be a homopolymer or a copolymer. The radical curable organic groups may have 2 to 10 member atoms, the number of atoms including each and all integers between 2 and 10. Suitable alkenyl groups for the radical curable organic groups include, but are not limited to, vinyl, allyl, butenyl, and hexenyl.

The remaining silicon-bonded organic groups in the polyorganosiloxane are organic groups free of aliphatic unsaturation. These organic groups may be independently selected from monovalent hydrocarbon and monovalent halogenated hydrocarbon groups free of aliphatic unsaturation. These monovalent groups may have from 1 to 20 carbon atoms, the number of carbon atoms including each and all integers between 1 and 20, alternatively 1 to 10 carbon atoms, and are exemplified by, but not limited to alkyl such as methyl, ethyl, propyl, pentyl, octyl, undecyl, and octadecyl; cycloalkyl such as cyclohexyl; aryl such as phenyl, tolyl, xylyl, benzyl, and 2-phenylethyl; and halogenated hydrocarbon groups such as 3,3,3-trifluoropropyl, 3-chloropropyl, and dichlorophenyl. At least 50 percent, alternatively at least 80%, of the organic groups free of aliphatic unsaturation in the polyorganosiloxane may be methyl.

The viscosity of the polyorganosiloxane for component (a) at 25° C. varies with molecular weight and structure, but may range from 0.001 to 100,000 Pascal·seconds (Pa·s), alternatively 0.01 to 10,000 Pa·s, and alternatively 0.01 to 1,000 Pa·s. Viscosity was measured by ASTM D 1084 at a temperature of 25° C.

Methods of preparing polyorganosiloxanes suitable for use in the adhesive composition, such as hydrolysis and condensation of the corresponding organohalosilanes or equilibration of cyclic polydiorganosiloxanes, are known in the art.

Component (a) may be a single polyorganosiloxane or a combination comprising two or more polyorganosiloxanes that differ in at least one of the following properties: structure, viscosity, average molecular weight, siloxane units, and sequence. The exact amount of component (a) that may be added to the composition depends on various factors including the type of component (a) in the composition and the type and amount of component (b) in the composition. However, the amount of component (a) may be 50% to 99% based on the weight of the radical curable adhesive composition.

Component (b), the radical initiator, may be a thermal radical initiator or a radiation radical initiator. Thermal radical initiators include, but are not limited to, dicumyl peroxide, n-butyl 4,4'-bis(butylperoxy)valerate, 1,1-bis(t-butylperoxy)-3,3,5 trimethyl cyclohexane, di-t-butyl peroxide and 2,5-di-(t-butylperoxy)-2,5 dimethyl hexane, 1,1-bis(tert-amylperoxy)cyclohexane (Luperox® 531M80); 2,2-bis(tert-butylperoxy)butane; 2,4-pentanedione peroxide (Luperox® 224), 2,5-bis(tert-butylperoxy)-2,5-dimethylhexane (Luperox® 101), 2,5-di(tert-butylperoxy)-2,5-dimethyl-3-hexyne; 2-butanone peroxide, benzoyl peroxide, cumene hydroperoxide, di-tert-amyl peroxide (Luperox® DTA®), lauroyl peroxide (Luperox® LP), tert-butyl hydroperoxide; tert-butyl peracetate; tert-butyl peroxybenzoate; tert-butylperoxy 2-ethylhexyl carbonate; di(2,4-dichlorobenzoyl) peroxide; dichlorobenzoylperoxide (available as Varox® DCBP from R. T. Vanderbilt Company, Inc. of Norwalk, Conn., USA); di(tert-butylperoxyisopropyl)benzene, di(4-methylbenzoyl) peroxide, butyl 4,4-di(tert-butylperoxy)valerate, 3,3,5,7,7-pentamethyl-1,2,4-trioxepane; tert-butyl peroxy-3,5,5-trimethylhexanoate; tert-butyl cumyl peroxide; di(4-tert-butylcyclohexyl) peroxydicarbonate (available as Perkadox 16); dicetyl peroxydicarbonate; dimyristyl peroxydicarbonate; 2,3-dimethyl-2,3-diphenylbutane, dioctanoyl peroxide; tert-butylperoxy 2-ethylhexyl carbonate; tert-amyl peroxy-2-ethylhexanoate, tert-amyl peroxypivalate; and combinations thereof.

Examples of such thermal radical initiators are commercially available under the following trade names: Luperox® sold by Arkema, Inc. of Philadelphia, Pa., U.S.A.; Trigonox and Perkadox sold by Akzo Nobel Polymer Chemicals LLC of Chicago, Ill., U.S.A., VAZO sold by E.I. duPont deNemours and Co. of Wilmington, Del., USA; VAROX® sold by R.T. Vanderbilt Company, Inc. of Norwalk, Conn., U.S.A.; and Norox sold by Syrgis Performance Initiators, Inc. of Helena, Ark., U.S.A. The concentration of the thermal radical initiator may range from 0.01% to 15%, alternatively from 0.1% to 5%, and alternatively 0.1% to 2%, based on the weight of the composition.

Epoxy Curable Adhesive Composition

Alternatively, an epoxy curable silicone adhesive composition may be used in the method described herein as the curable adhesive composition in step (I). A suitable epoxy curable silicone adhesive composition useful in the present method comprises:

(a) a polyorganosiloxane containing an average of at least two epoxy functional organic groups per molecule, and
(b) an epoxy curing agent.

Suitable epoxy functional groups for component (a) include, but are not limited to, 3,4-epoxycyclohexyl; epoxyethyl (oxiranyl); epoxymethyl; glycidoxy; glycidoxyalkyl such as glycidoxymethyl, 2-glycidoxyethyl, 3-glycidoxypropyl and 4-glycidoxybutyl; epoxycyclohexylalkyl groups such as 4-methyl-3,4-epoxycyclohexyl, 2-(3,4-epoxycyclohexyl)ethyl, 3-(3,4-epoxycyclohexyl)propyl, 3,4-epoxy-4-methyl-cylohexyl, 2,3-epoxycylopentyl, and (2,3-epoxycylopentyl)methyl; and oxiranylalkyl such as 4-oxiranylbutyl and 8-oxiranyloctyl. Alternatively, component (a) may have cycloaliphatic epoxy functional groups. Examples of suitable cycloaliphatic epoxy functional groups include, but are not limited to:

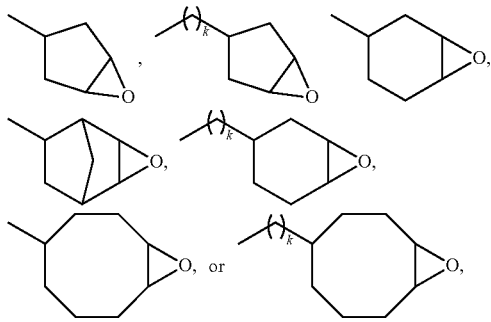

where each subscript k independently has a value ranging from 1 to 5. The radical curable organic groups in the polyorganosiloxane may be located at terminal, pendant, or both terminal and pendant positions.

The remaining silicon-bonded organic groups in the polyorganosiloxane are organic groups free of aliphatic unsaturation. These organic groups may be independently selected from monovalent hydrocarbon and monovalent halogenated hydrocarbon groups free of aliphatic unsaturation. These monovalent groups may have from 1 to 20 carbon atoms, alternatively 1 to 10 carbon atoms, and are exemplified by, but not limited to alkyl such as methyl, ethyl, propyl, pentyl, octyl, undecyl, and octadecyl; cycloalkyl such as cyclohexyl; aryl such as phenyl, tolyl, xylyl, benzyl, and 2-phenylethyl; and halogenated hydrocarbon groups such as 3,3,3-trifluoropropyl, 3-chloropropyl, and dichlorophenyl. At least 50 percent, alternatively at least 80%, of the organic groups free of aliphatic unsaturation in the polyorganosiloxane may be methyl.

The viscosity of the polyorganosiloxane for component (a) in the epoxy curable silicone adhesive composition at 25° C. varies with molecular weight and structure, but may range from 0.001 to 100,000 Pascal·seconds (Pa·s), alternatively 0.01 to 10,000 Pa·s, and alternatively 0.01 to 1,000 Pa·s. Viscosity was measured by ASTM D 1084 at a temperature of 25° C.

Methods of preparing polyorganosiloxanes suitable for use in the epoxy curable adhesive composition, such as hydrolysis and condensation of the corresponding organohalosilanes or equilibration of cyclic polydiorganosiloxanes, are known in the art.

Component (a) may be a single polyorganosiloxane or a combination comprising two or more polyorganosiloxanes that differ in at least one of the following properties: structure, viscosity, average molecular weight, siloxane units, and sequence. The exact amount of component (a) that may be added to the composition depends on various factors including the type of component (a) in the composition and the type and amount of component (b) in the composition. However, the amount of component (a) may range from 50% to 99% based on the weight of the epoxy curable adhesive composition.

Component (b) in the epoxy curable adhesive composition may be a radiation photoinitiator, for example, the radiation photoinitiator may be any conventional photoinitiator known in the art, such as those disclosed in U.S. Pat. Nos. 4,310,469 to Crivello and 4,313,988 to Koshar, et al. and European Patent Application No. EP 0 562 922. The radiation photoinitiator may comprise a cationic photoinitiator. The cationic photoinitiator can be any cationic photoinitiator capable of initiating cure (cross-linking) of the curable adhesive composition upon exposure to radiation having a wavelength ranging from 150 to 800 nm Examples of cationic photoinitiators include, but are not limited to, onium salts.

Suitable onium salts include salts having a formula selected from $R^{19}_2 I^+ MG_u^-$, $R^{19}_3 S^+ MG_u^-$, $R^{19}_3 Se^+ MG_u^-$, $R^{19}_4 P^+ MG_u^-$, and $R^{19}_4 N^+ MG_u^-$, where each $R^{19}$ is independently a monovalent organic group such as a monovalent hydrocarbon group having from 1 to 30 carbon atoms; M is an element selected from transition metals, rare earth metals, lanthanide metals, metalloids, phosphorus, and sulfur; G is a halogen atom (e.g., Cl, Br, or I), and subscript u has a value such that the product u (charge on G+oxidation number of M)=−1. Examples of substituents on the hydrocarbon group include, but are not limited to, alkoxy groups of 1 to 8 carbon atoms, alkyl groups of 1 to 16 carbon atoms, nitro, chloro, bromo, cyano, carboxyl, mercapto, and heterocyclic aromatic groups, such as pyridyl, thiophenyl, and pyranyl. Examples of metals represented by M include, but are not limited to, transition metals, such as Fe, Ti, Zr, Sc, V, Cr, and Mn; lanthanide metals, such as Pr and Nd; other metals, such as Cs, Sb, Sn, Bi, Al, Ga, and In; metalloids, such as B and As; and P. The formula $MG_u^-$ represents a non-basic, non-nucleophilic anion. Examples of anions having the formula $MG_u^-$ include, but are not limited to, $BF_4^-$, $PF_6^-$, $AsF_6^-$, $SbF_6^=$, $SbCl_6^-$, and $SnCl_6^-$.

Examples of onium salts include, but are not limited to, bis-diaryliodonium salts such as bis(dodecylphenyl)iodonium salts exemplified by bis(dodecyl phenyl)iodonium hexafluoroarsenate and bis(dodecylphenyl)iodonium hexafluoroantimonate; alkylphenyliodonium salts such as alkylphenyliodonium hexafluoroantimonate; diaryliodonium salts of sulfonic acids, triarylsulfonium salts of sulfonic acids, diaryliodonium salts of boronic acids, and triarylsulfonium salts of boronic acids.

Examples of diaryliodonium salts of sulfonic acids include, but are not limited to, diaryliodonium salts of perfluoroalkylsulfonic acids, such as diaryliodonium salts of perfluorobutanesulfonic acid, diaryliodonium salts of perfluoroethanesulfonic acid, diaryliodonium salts of perfluorooctanesulfonic acid, and diaryliodonium salts of trifluoromethanesulfonic acid; and diaryliodonium salts of aryl sulfonic acids, such as diaryliodonium salts of para-toluenesulfonic acid, diaryliodonium salts of dodecylbenzenesulfonic acid, diaryliodonium salts of benzenesulfonic acid, and diaryliodonium salts of 3-nitrobenzenesulfonic acid.

Examples of triarylsulfonium salts of sulfonic acids include, but are not limited to, triarylsulfonium salts of perfluoroalkylsulfonic acids, such as triarylsulfonium salts of perfluorobutanesulfonic acid, triarylsulfonium salts of perfluoroethanesulfonic acid, triarylsulfonium salts of perfluorooctanesulfonic acid, and triarylsulfonium salts of trifluoromethanesulfonic acid; and triarylsulfonium salts of aryl sulfonic acids, such as triarylsulfonium salts of para-toluenesulfonic acid, triarylsulfonium salts of dodecylbenzenesulfonic acid, triarylsulfonium salts of benzenesulfonic acid, and triarylsulfonium salts of 3-nitrobenzenesulfonic acid.

Examples of diaryliodonium salts of boronic acids include, but are not limited to, diaryliodonium salts of perhaloarylboronic acids. Examples of triarylsulfonium salts of boronic acids include, but are not limited to, triarylsulfonium salts of perhaloarylboronic acid.

The cationic photoinitiator can be a single cationic photoinitiator or a combination comprising two or more different cationic photoinitiators, each as described above. The concentration of the cationic photoinitiator may range from 0.01% to 15%, alternatively 0.1% to 10%, alternatively 0.1% to 5%, and alternatively 0.1% to 2%, based on the weight of the curable silicone adhesive composition.

The radical curable adhesive composition and/or the epoxy curable adhesive composition may optionally further comprise one or more of the optional components described above in paragraphs [0044] to [0066].

Method

A temporary wafer bonding method comprises:
(1) forming a film on a first substrate, where the film comprises:
  (I) a curable adhesive composition, and
  (II) a degradation agent;
optionally (2) heating the product of step (1),
(3) applying a second substrate to the film, where at least one of the first substrate and the second substrate is a semiconductor wafer,
(4) curing the film to form a cured film,
(5) processing the semiconductor wafer,
(6) degrading the cured film by heating,
optionally (7) immersing the product of step (6) in a solvent,
(8) separating the first substrate and the second substrate, and
optionally (9) immersing the semiconductor wafer in a solvent or etching solution. Optional steps (7) and/or (9) may be performed if any residue is left on the wafer after steps (6), and/or (8), respectively.

Step (1) may be performed using any conventional method, such as spin coating, dipping, spraying, or printing a combination of the curable adhesive composition and the degradation agent on the first substrate to form the film. Alternatively, the film may be applied by spin coating at a speed of 500 to 6,000 rpm for 5 to 60 seconds. The curable adhesive composition and the degradation agent may be combined by any convenient means, such as mixing. The volume of applied in the spin coating method may range from 0.1 to 5 milliliters (mL). The spin speed, spin time, and volume can be adjusted to produce a film having a thickness ranging from 0.1 to 200 micrometers (μm). The first substrate may be a semiconductor wafer or a wafer carrier. The film may be applied to the surface of a semiconductor wafer having a patterned feature or a device disposed thereon, for example integrated circuits or MicroElectro Mechanical Systems (MEMS) devices.

Step (2) is optional. However, when present, step (2) may be performed by heating the film by any conventional means. The time and temperature for heating depends on the specific adhesive composition selected and the purpose of step (2). Step (2) may be performed for the purpose of removing at least some of the solvent, when a solvent is present in the adhesive composition; or partially curing the adhesive composition; or both. For solvent removal of the hydrosilylation curable adhesive composition and/or the radical curable adhesive composition described above, step (2) may be performed at a temperature and for a time sufficient to remove the solvent, but where the temperature is lower than the temperature at which the hydrosilylation curable adhesive composition cures, for example by heating at 50° C. to 120° C. for up to 5 minutes. For partial cure of the hydrosilylation curable adhesive composition described above, step (2) may be performed by heating the hydrosilylation curable adhesive composition at a temperature up to 200° C. for 1 to 30 minutes; alternatively by heating the hydrosilylation curable adhesive composition at a temperature of 80° C. to 200° C. for 2 to 4 minutes.

Step (3) may be performed by any conventional means. For example, the second substrate may be contacted with the film and pressed together manually or by mechanical means.

Step (4) may be performed by heating the film at a temperature and for a time sufficient to cure the film, for example for the hydrosilylation curable adhesive composition described above, step (4) may be performed by heating at a temperature of 150° C. to 250° C. for 30 to 120 minutes. Alternatively, for the radical curable adhesive composition described above, step (4) may be performed by heating at a temperature ranging from 120° C. to 170° C.

Step (5) may be performed by any conventional means, such as thinning, electroplating, metallization, plasma treatment, photoresist processing, dielectric coating, and a combination thereof.

Step (6) may be performed by heating at a temperature sufficient to degrade the adhesive such that the first and second substrates separate cleanly in step (8). The exact temperature and amount of time for heating depend on various factors including the strength and amount of the degradation agent in the curable adhesive composition and the temperature the semiconductor wafer and any architecture thereon can withstand. However, temperature may range from 260° C. to 450° C. for a time ranging from 0.1 to 2 hours.

Step (7) is optional, and the curable adhesive composition, the degradation agent, and the conditions in steps (1) to (6) are preferably selected such that step (7) is not used. However, when present, step (7) may be performed by any convenient means. For example, step (7) may be performed by immersing the product of step (6) in a solvent. Suitable solvents are known in the art and are commercially available. The solvent may be an organic solvent having from 3 to 20 carbon atoms. Examples of solvents include aliphatic hydrocarbons, such as nonane, decalin, and dodecane; aromatic hydrocarbons, such as mesitylene, xylene, and toluene; esters, such as ethyl acetate and 7-butyrolactone; ethers, such as n-butyl ether and polyethylene glycol monomethylether; ketones, such as methyl isobutyl ketone and methyl pentyl ketone; silicone fluids such as linear, branched, and cyclic polydimethylsiloxanes and combinations of such solvents.

Alternatively, step (7), when present, may be performed by immersing the product of step (6) in an etching solution. The etching solution may comprise (i) an organic solvent and (ii) a base or an acid. The organic solvent may be, for example, a monohydric alcohol such as methanol, ethanol, n-propanol, isopropanol, n-butanol, isobutanol, tert-butanol, and a combination thereof; a dihydric alcohol such as ethylene glycol and propylene glycol and a combination thereof; a monoether such as ethylene glycol ether and propylene glycol ether and a combination thereof; a diether such as ethylene diglycol ether, propylene diglycol ether, 1-methoxy-2-propanol, and a combination thereof; a polar aprotic solvent such as N-methylpyrrolidone, tetrahydrofuran, dimethylsulfoxide, gamma-butyrolactone, and dimethylacetamide, and a combination thereof.

The base may comprise an inorganic base such as ammonium hydroxide, cesium hydroxide, potassium hydroxide, sodium hydroxide, and a combination thereof. Alternatively, the base may comprise an organic base such as phosphazene; tetraalkyl ammonium hydroxides including tetramethyl ammonium hydroxide, tetraethyl ammonium hydroxide, tetrabutyl ammonium hydroxide and tetrapropylammonium hydroxide; and a combination thereof. The amount of base in the etching solution may range from 0.01% to as high as the solubility limit of the base in the solvent, alternatively up to 10%.

The acid may comprise an inorganic acid such as hydrochloric acid, hydrofluoric acid, nitric acid, sulfuric acid, or a combination thereof. Alternatively, the acid may comprise an organic acid such as an organosulfonic acid. Examples of organosulfonic acids include dodecylbenzene sulfonic acid, methylsulfonic acid, toluene sulfonic acid, and a combination thereof. The amount of acid in the etching solution may range from 0.01% to as high as the solubility limit of the acid in the solvent, alternatively up to 10%.

The etching solution may be applied by any conventional method, including spraying or immersion. Exposure to the etching solution may be, for example, by immersion. The exact time and temperature for immersion depends on various factors including the exact components of the curable adhesive composition. However, immersion may be carried out at ambient temperature for 1 minute to 72 hours, alternatively 24 hours to 72 hours. Immersion times may be shorter at elevated temperatures. Alternatively, exposure to the etching solution may be by continuous spraying such that the residue is exposed to the etching solution for a time sufficient to remove the residue. Exposure to the etching solution be at ambient or elevated temperatures. The temperature during exposure may be 15° C. to 150° C. It is expected that higher temperatures will provide faster etch rates.

Step (8) may be performed by any convenient means, such as by hand or by mechanical means.

Step (9) is optional, and the curable adhesive composition, the degradation agent, and the conditions in steps (1) to (6) are preferably selected such that step (9) is not used. However, when present, step (9) may be performed by immeersing a product of step (8) in a solvent, such as that described above for claim 7), or in an etching solution such as that described above for step (7).

EXAMPLES

These examples are intended to illustrate the invention to one of ordinary skill in the art and should not be interpreted as limiting the scope of the invention set forth in the claims.

Example 1

Preparation of Potassium Tert-Butoxide Doped Q1-4010 Adhesive

Figure 2:
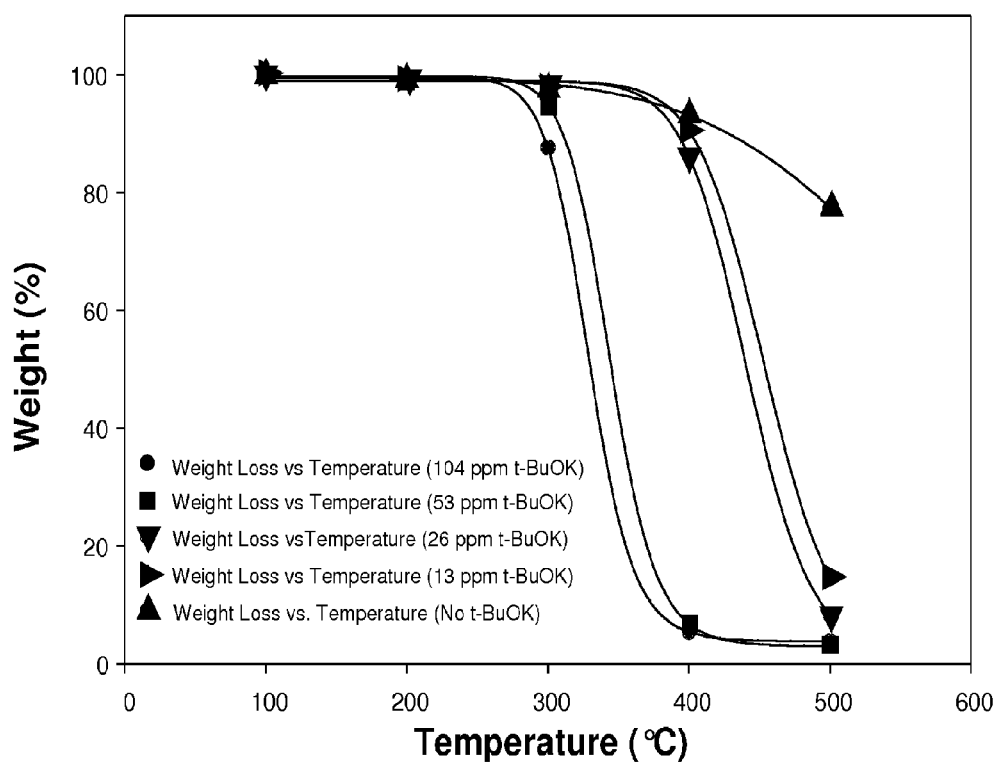
FIG. 2 is a plot of weight loss vs. temperature for Q1-4010 adhesive containing 104, 53, 26, 13 and 0 ppm of potassium t-butoxide (heating rate 5° C./minute under nitrogen atmosphere) from Example 1, below.

Into a plastic dental cup was placed 40 g of Dow Corning® Q1-4010 conformal coating, which is a commercially available hydrosilylation curable adhesive composition from Dow Corning Corporation of Midland, Mich., USA, to which was added a small amount of a 1.0 molar solution of potassium tert-butoxide in tetrahydrofuran (Aldrich). Following the addition the dental cup was quickly closed and the contents mixed two times for 30 second each on a dental mixer to provide a master-batch formulation. The master-batch formulation was then subjected to bubbling carbon dioxide for a period of 15 minutes and then degassed under a vacuum. To prepare a series of samples with varying levels of potassium tert-butoxide the master-batch formulation was diluted by adding Dow Corning® Q1-4010 until the desired level of potassium tert-butoxide was achieved in the formulation. A series of samples with potassium tert-butoxide was prepared with levels ranging from 0 to 104 ppm. These were then subjected to two 30 second mixes using a dental mixer. The prepared samples were then poured into aluminum weighing pans to a depth of 5 millimeters (mm) and degassed before curing in an air oven at 130° C. for 2 hours. Following cure, all of the samples were isolated as hard elastomers with no bubbling. The samples were then analyzed by thermal gravitational analysis (TGA) to determine the decomposition profiles for the formulations as a function of the level of potassium tert-butoxide. For TGA, samples were placed into a Pt pan and heated under nitrogen at a rate of 5° C./minute to the upper temperature limit using a TA Instruments Q500 V6.7 Build 203 TGA. Results are in Table 1 and FIGS. 1 and 2.

| Sample | t-BuOK (ppm) | $D_{max}$ (° C.) | $Res_{500° C.}$ (%) |
|---|---|---|---|
| Example 1a | 104 | 329 | 3.8 |
| Example 1b | 53 | 358 | 3.0 |
| Example 1c | 26 | 432 | 8.3 |
| Example 1d (comparative) | 13 | 434 | 14.5 |
| Example 1e (comparative) | 0 | 492 | 77.4 |

Table 1: Thermal decomposition data for Q1-4010 adhesive containing varying levels of potassium t-butoxide (t-BuOK). $D_{max}$ is the maximum of percent weight loss against temperature (%/° C.), and $Res_{500° C.}$ is the percent residue remaining at 500° C. (heating rate 5° C./minute under nitrogen atmosphere). Results are in Table 2 and FIG. 2.

Reference Example 1

Temporary Adhesion Test for Potassium tert-Butoxide Doped Q1-4010 Adhesive

Silicon dice measuring 1 centimeter (cm)×1 cm were washed with isopropyl alcohol in an ultrasonic bath for 5 minutes followed by wiping with a clean cloth and heating to 130° C. in air for 15 minutes, and the thickness of the dice were measured. A small amount of the doped adhesive composition prepared in example 1 was applied to one die and a small amount of Potters Industries Glass Beads (#602589 (0.0017" maximum diameter) was placed on the surface of the adhesive. A second die was placed onto the top surface, and the two dice were compressed. The dice were then heated to 130° C. for 1 hour in an air circulating oven and then cooled. The thickness of the adhesive was calculated on the basis of the original die thicknesses and the thickness of the attached dice. Samples were prepared using adhesive examples 1a, 1d and 1e. Subjecting the as-prepared adhered dice to a shear force by hand failed to separate of the two dice.

The stacked die samples 1a, 1d and 1e were then subjected to heating at 329° C. (the maximum degradation temperature for sample 1a) in air for a period of 30 minutes. After removal and cooling, the dice were again subjected to a shear force by hand. This resulted in the release of the all 1a samples giving two free dice. Samples made using adhesive 1d and 1e failed to release under these thermal conditions.

| Sample | Glass Beads | Adhesive Thickness (mm) | Release After Shear? |
|---|---|---|---|
| Example 1a | Yes | 0.046 | Yes |
| Example 1a | Yes | 0.058 | Yes |
| Example 1a | No | 0.059 | Yes |
| Example 1a | No | 0.06 | Yes |
| Example 1d (comparative) | Yes | 0.04 | No |
| Example 1d (comparative) | Yes | 0.037 | No |
| Example 1e (comparative) | Yes | 0.043 | No |
| Example 1e (comparative) | Yes | 0.036 | No |

Table 2: Die adhesion as a function of potassium t-butoxide level following isothermal heating at 329° C. ($T_{isothermal}$) for 30 minutes under an air atmosphere. Sample 1a contained 104 ppm potassium t-butoxide ($D_{max}$=329° C.=$T_{isothermal}$), sample 1d contained 13 ppm potassium t-butoxide ($D_{max}$=434° C.>$T_{isothermal}$), and sample 1e contained no potassium t-butoxide ($D_{max}$=492° C.>>$T_{isothermal}$).

Example 2

Preparation of Phosphazene Base Doped Q1-4010 Adhesive

Into a plastic dental cup was placed 40 g of Dow Corning® Q1-4010 to which was added a small amount of a 1.0 molar solution of phosphazene base $P_4$-t-Bu in hexane (from Aldrich) that had previously been diluted to 10% in decane. Immediately following the addition the cup was quickly closed and the contents mixed two times for 30 seconds each on a dental mixer to provide a master-batch formulation. The master-batch formulation was then degassed prior to being used to formulate a series samples with varying levels of phosphazene base through dilution by adding Dow Corning® Q1-4010. A series of samples with phosphazene base was prepared with levels ranging from 0 to 450 ppm. Additional samples were also prepared by adding a small amount of acetic acid to some of the phosphazene base containing formulations to observe the impact on the decomposition profiles. Each of these samples was then subjected to two 30 second mixes using a dental mixer. The samples were then poured into aluminum weighing pans to a depth of 5 mm and degassed before curing in an air oven at 130° C. for 1 hour. Following cure, all of the samples were isolated as spongy elastomers with foaming or significant bubbling. The samples were analyzed by thermal gravitational analysis (TGA) to determine the decomposition profiles for the formulations as a function of the level of the phosphazene base.

| Sample | $P_4$—t-Bu (ppm) | Acetic Acid (ppm) | $D_{max}$ (° C.) | $Res_{400° C.}$ (%) |
|---|---|---|---|---|
| Example 2a (comparative) | 0 | 0 | >400 | 93.1 |
| Example 2b | 43 | 0 | >400 | 94.5 |
| Example 2c | 43 | 455 | >400 | 94.7 |
| Example 2d (comparative)* | 450 | 0 | N/A | N/A |
| Example 2e (comparative)* | 450 | 1525 | N/A | N/A |
| Example 2f | 109 | 0 | >400 | 92.2 |
| Example 2g | 109 | 0 | >400 | 94.3 |

*denotes that these samples were not examined because they did not cure.

Table 3: Thermal decomposition data for Q1-4010 adhesive containing varying levels of phosphazene base ($P_4$-t-Bu, which is commercially available from Aldrich) and acetic acid. $D_{max}$ is the maximum of percent weight loss against temperature (%/° C.), and $Res_{400° C.}$ is the percent residue remaining at 400° C. (heating rate 5° C./minute under nitrogen atmosphere).

Example 3

Preparation of Tin Doped Q1-4010 Adhesive

Figure 3:
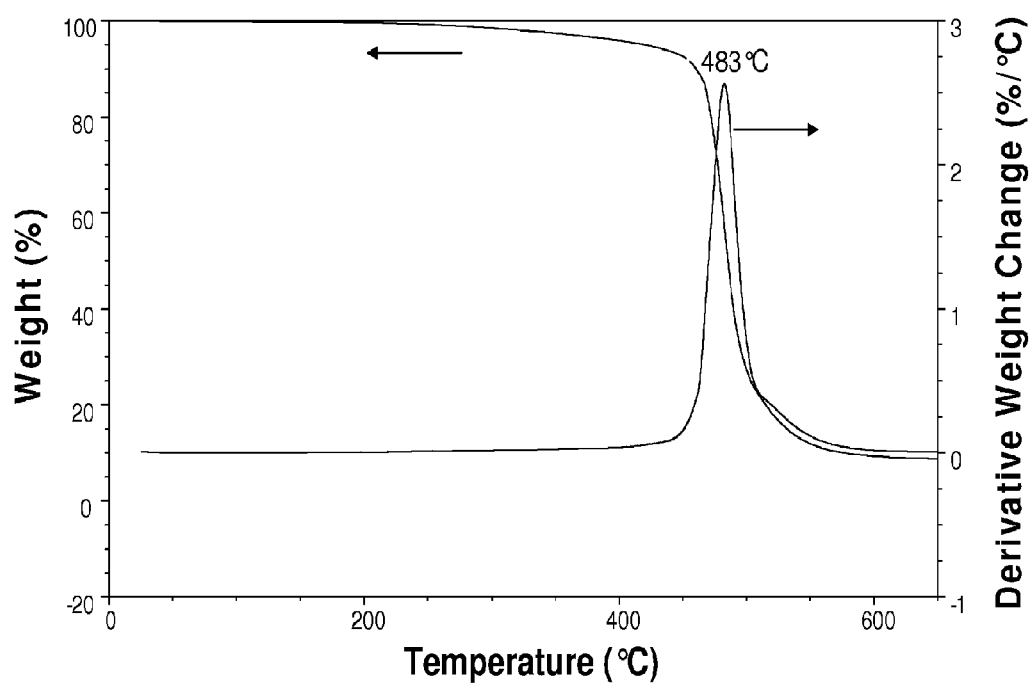
FIG. 3 is a thermal decomposition (TGA) profile for Q1-4010 adhesive containing 105 ppm of dimethyl tin dineodecanoate (Fomrez UL-28) (heating rate 5° C./minute under nitrogen atmosphere) from Example 3, below.

Into a plastic dental cup was placed 40 g of Dow Corning® Q1-4010 conformal coating to which was added a 105 ppm of dimethyl tin dineodecanoate (Fomrez UL-28). Following the addition the dental cup was quickly closed and the contents mixed two times for 30 second each on a dental mixer. The sample was poured into an aluminum weighing pan to a depth of 5 mm and degassed before curing in an air oven at 130° C. for 2 hours. Following cure the sample was isolated as a hard elastomer with no bubbling. The sample was then analyzed by TGA to determine the decomposition profiles for the sample as a function of the level of dimethyl tin dineodecanoate. Results are in FIG. 3.

Example 4

Preparation of Lithium Tert-Butoxide Doped Q1-4010 Adhesive

Into a plastic dental cup was placed 40 g of Dow Corning® Q1-4010 conformal coating to which was added a small amount of a 1.0 molar solution of lithium tert-butoxide in tetrahydrofuran (Aldrich). Following the addition the dental cup was quickly closed and the contents mixed two times for 30 seconds each on a dental mixer to provide a masterbatch formulation. To prepare a series of samples with varying levels of lithium tert-butoxide, the masterbatch formulation was diluted by adding Dow Corning® Q1-4010 until the desired level of lithium tert-butoxide was achieved in the composition. A series of samples with lithium tert-butoxide was prepared with levels ranging from 20 to 80 ppm. These were each then subjected to two 30 second mixes using a dental mixer. The samples were then poured into aluminum weighing pans to a depth of 5 mm and degassed before curing in an air oven at 130° C. for 1 hour. Following cure, all of the samples were isolated as hard elastomers with no bubbling. The samples were then analyzed by TGA to determine the decomposition profiles for the compositions as a function of the level of lithium tert-butoxide.

| Sample | Ppm t-BuOLi | $D_{max}$ (° C.) | $Res_{700° C.}$ (%) |
|---|---|---|---|
| Example 4a | 80 | 431 | 23 |
| Example 4b | 40 | 440 | 28 |
| Example 4c | 20 | 447 | 28 |

Table 4: Thermal decomposition data for Q1-4010 adhesive containing varying levels of lithium t-butoxide. $D_{max}$ is the maximum of percent weight loss against temperature (%/° C.), and $Res_{700° C.}$ is the percent residue remaining at 700° C. (heating rate 5° C./minute under nitrogen atmosphere).

Example 5

Preparation of Resinless Potassium Tert-Butoxide Doped Polydimethylsiloxane Adhesive A resinless polydimethylsiloxane adhesive curable by addition cure was prepared by mixing a solution of 83.3 parts Vinyl functional polydiorganosiloxane 1, 11.5 parts Vinyl functional polydiorganosiloxane 2, 0.91 parts Adhesion promoter, 0.34 parts Catalyst, 0.39 parts methylbutynol and 3.9 parts of SiH polymer.

Adhesion promoter was a mixture of 50 parts glycidoxypropyltrimethoxysilane per 46 parts hydroxy-terminated methylvinylsiloxane. Vinyl functional polydiorganosiloxane 1 was a vinyl-terminated polydimethylsiloxane having vinyl content ranging from 0.38% to 0.6% as measured by infra-red and viscosity ranging from 300 to 500 mPa·s as measured with a cone and plate viscometer at 12 rpm. Catalyst was a mixture of 1.5 parts 1,3-diethenyl-1,1,3,3-tetramethyldisiloxane complex with platinum in Vinyl functional polydiorganosiloxane 1. Vinyl functional polydiorganosiloxane 2 was a vinyl-terminated polydimethylsiloxane having vinyl content ranging from 0.11% to 0.23% by weight compared to the molecular weight and viscosity ranging from 7,000 to 12,000 mPa·s measured with a cone and plate viscometer at 0.6 rpm. SiH polymer was trimethylsiloxy-terminated poly(dimethyl/methylhydrogen)siloxane having a viscosity of 5 mm$^2$/s at 25° C. and SiH content 7,600 ppm.

The components were added in the order given and mixed with a dental mixer for 30 seconds each after the addition of the methylbutynol and the addition of the SiH polymer. The sample was split into two parts; 40 g to prepare a potassium butoxide masterbatch and a second part to dilute the masterbatch to achieve a series of samples with a range of potassium butoxide levels. Into a plastic dental cup was placed 40 g of the adhesive composition to which was added a small amount of a 1.0 molar solution of potassium tert-butoxide in tetrahydrofuran (Aldrich). Following the addition the dental cup was quickly closed and the contents mixed two times for 30 seconds each on a dental mixer to provide a masterbatch formulation. The masterbatch formulation was then subjected to bubbling carbon dioxide for a period of 15 minutes and then degassed under a vacuum.

To prepare a series of samples with varying levels of potassium tert-butoxide the master-batch formulation was diluted by adding additional curable adhesive composition until the desired level of potassium tert-butoxide was achieved in the composition. A series of samples with potassium tert-butoxide was prepared with levels ranging from 0 to 117 ppm. These were then subjected to two 30 second mixes using a dental mixer. The samples were then poured into aluminum weighing pans to a depth of 5 mm and degassed before curing in an air oven at 130° C. for 1 hour. Following cure, all of the samples were isolated as hard elastomers with no bubbling.

Figure 4:
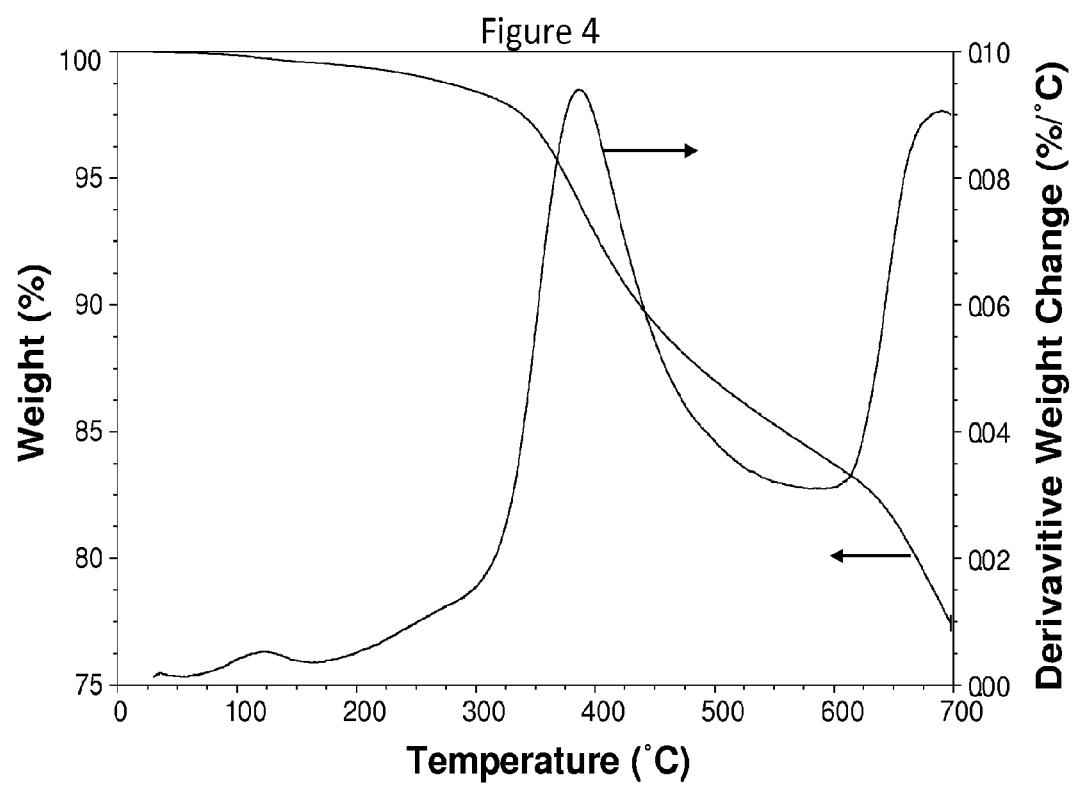
FIG. 4 is a thermal decomposition (TGA) profile for the experimental resinless adhesive containing no potassium t-butoxide (heating rate 5° C./minute under nitrogen atmosphere) from Example 5, below.
Figure 5:
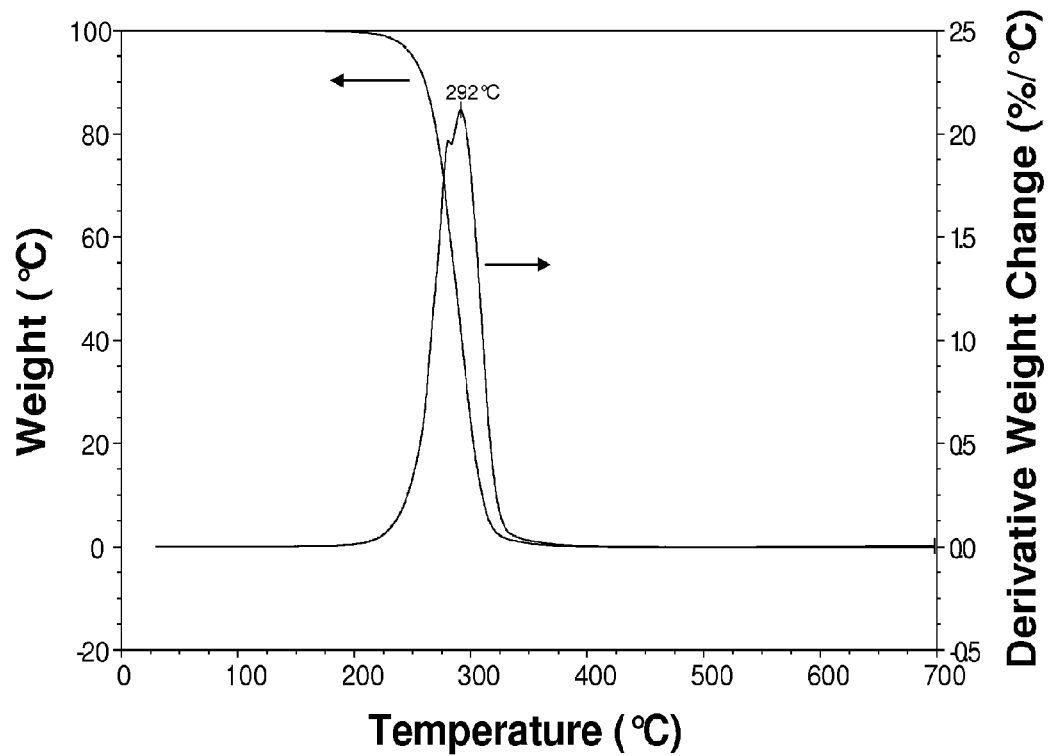
FIG. 5 is a thermal decomposition (TGA) profile for the experimental resinless adhesive containing 117 ppm potassium t-butoxide (heating rate 5° C./minute under nitrogen atmosphere) from Example 5, below.

The samples were then analyzed by TGA to determine the decomposition profiles for the formulations as a function of the level of potassium tert-butoxide. Results are in FIGS. 4 and 5 and Table 5.

| Sample | Ppm t-BuOK | $D_{max}$ (° C.) | $Res_{700° C.}$ (%) |
|---|---|---|---|
| Example 5a | 117 | 292 | 0.13 |
| Example 5b | 58 | 317 | 0.29 |
| Example 5c | 29 | 328 | 0.34 |
| Example 5d (comparative) | 0 | 383 | 76.7 |

Table 5: Thermal decomposition data for a resinless experimental curable adhesive composition containing varying levels of potassium t-butoxide. $D_{max}$ is the maximum of percent weight loss against temperature (%/° C.), and $Res_{700° C.}$ is the percent residue remaining at 700° C. (heating rate 5° C./minute under nitrogen atmosphere).

Example 6

Preparation of Radically Curable Base Doped Polydimethylsiloxane Adhesive

Figure 6:
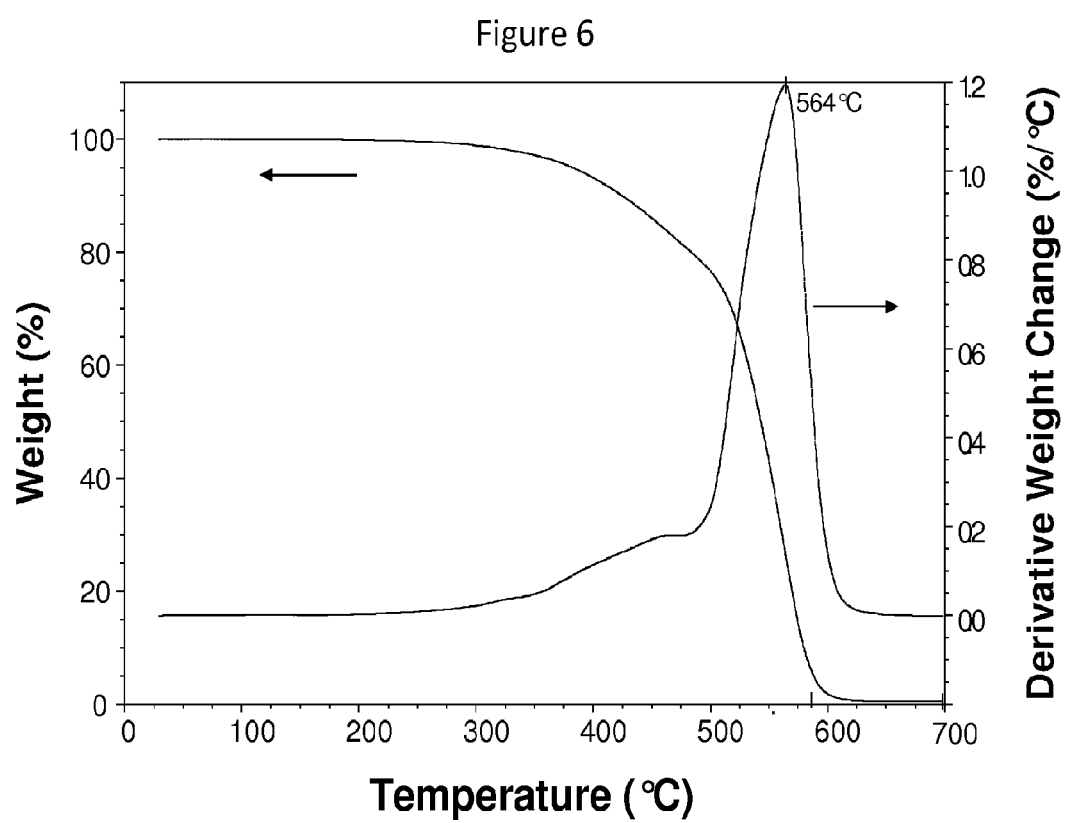
FIG. 6 is a thermal decomposition (TGA) profile for the experimental radically cured adhesive containing no base (heating rate 5° C./minute under nitrogen atmosphere) from Example 6, below.

A radical curable adhesive composition was prepared by mixing a solution of 40.0 parts Vinyl functional polydiorganosiloxane 1, 0.32 parts Adhesion promoter and 0.48 parts 1,1-bis-(t-butylperoxy)-3,3,5-trimethylcyclohexane. The components were added in the order given and mixed with a dental mixer for 30 seconds. The same composition was repeated to prepare samples of adhesive composition with 127 ppm phosphazene base, 103 ppm potassium t-butoxide and 89 ppm lithium t-butoxide. The samples were then poured into aluminum weighing pans to a depth of 5 mm and degassed before curing under a partial nitrogen atmosphere at 150° C. for 1 hour. Following cure, all of the samples were isolated as hard elastomers but with a thin film of liquid siloxane on the surface that was removed using a cloth. The samples were then analyzed by thermal gravitational analysis to determine the decomposition profiles for the formulations as a function of the level of degradation agent. Results are in Table 6 and FIGS. 6 and 7.

| Sample | Base | ppm Base | $D_{max}$ (° C.) | $Res_{700° C.}$ (%) |
|---|---|---|---|---|
| Example 6a | None | 0 | 564 | 0.54 |
| Example 6b | P4—t-Bu | 127 | 550 | 0.67 |
| Example 6c | t-BuOK | 103 | 361 | 0.76 |
| Example 6d | t-BuOLi | 89 | 376 | 0.5 |

Table 6: Thermal decomposition data for an experimental radically cured adhesive containing varying levels of different bases. $D_{max}$ is the maximum of percent weight loss against temperature (%/° C.), and $Res_{700° C.}$ is the percent residue remaining at 700° C. (heating rate 5° C./minute under nitrogen atmosphere).

Example 7

Sample 1a prepared in example 1 was heated at 329° C. A plot of isothermal weight loss as a function of time is shown in FIG. 8. This example shows that most of the film is decomposed in 30 minutes. This method is beneficial because no solvent or etching solution is needed to remove residue from the wafer.

INDUSTRIAL APPLICABILITY

Curable adhesive compositions containing degradation agents are useful in methods for temporary wafer bonding. The curable adhesive compositions may be cured to form silicone adhesives that thermally degrade and cleanly separate from substrates at elevated temperatures.

The curable adhesive compositions combined with degradation agents provide an improvement over known methods for separating wafers in temporary wafer bonding methods. For example, the level of degradation agent, such as a base, may be on the order of ppm levels in the present method. In contrast, the level of degradation agent in a solvent may range from 3% to 4. The formulation can also be customized with different amounts of base to customize temperature at which the adhesive degrades. Another benefit may be that a perforated wafer is not needed; but perforated wafers were used in the solvent process to ensure the solvent contacted the adhesive. Furthermore, in the process employing a perforated wafer and a required solvent or etching solution, the process was slow and could remove adhesive only from the surface. In contrast, in the method described herein, the adhesive may be removed through the bulk of the film and the interface is not as important as in the solvent/etching solution process.

The invention claimed is:

1. A method comprising:
    (1) forming a film on a first substrate, where the film comprises:
        (I) a curable adhesive composition,
        (II) a degradation agent; and
        optionally one or more components selected from (III) a solvent, (IV) an inhibitor, (V) a filler, (VI) a treating agent, (VII) a spacer, (VIII) an adhesion promoter, (IX) a surfactant, (X) a colorant, and (XI) an optical brightener;
    optionally (2) heating the product of step (1),
    (3) applying a second substrate to the film, where at least one of the first substrate and the second substrate is a semiconductor wafer,
    (4) curing the film to form a cured film,
    (5) processing the semiconductor wafer,
    (6) degrading the cured film by heating, optionally (7) removing residue from the semiconductor wafer with a solvent, (8) separating the first substrate and the second substrate, and optionally (9) removing residue from the semiconductor wafer with a solvent and/or an etching solution.

2. The method of claim 1, where the curable adhesive composition is a hydrosilylation curable adhesive composition comprising:
    (A) a polyorganosiloxane containing an average of at least two silicon-bonded unsaturated organic groups per molecule,
    (B) an organosilicon compound containing an average of at least two silicon-bonded hydrogen atoms per molecule in an amount sufficient to cure the composition, and
    (C) a catalytic amount of a hydrosilylation catalyst.

3. The method of claim 1, where the curable adhesive composition is a radical curable adhesive composition comprising:
    (a) a polyorganosiloxane containing an average of at least two radical curable organic groups per molecule, and
    (b) a radical initiator.

4. The method of claim 1, where step (1) is performed by a technique selected from spin coating, spray coating, dipping, or printing.

5. The method of claim 2, where component (A) comprises an alkenyl-functional polyorganosiloxane resin.

6. The method of claim 2, where component (B) is an organohydrogenpolysiloxane containing an average of at least two silicon bonded hydrogen atoms per molecule.

7. The method of claim 2, where component (C) is platinum complex with a vinyl functional polyorganosiloxane.

8. The method of claim 2, where component (II) is potassium t-butoxide, potassium silanolate, lithium t-butoxide, lithium silanolate, a combination thereof; or a carbonate thereof.

9. The method of claim 3, where component (a) is an alkenyl-terminated polydiorganosiloxane.

10. The method of claim 3, where component (b) is 1,1-bis-(t-butylperoxy)-3,3,5-trimethylcyclohexane.

11. The method of claim 1, where the first substrate is a first semiconductor wafer and the second substrate is a second semiconductor wafer.

12. The method of claim 1, where the first substrate is a semiconductor wafer and the second substrate is a wafer carrier.

13. The method of claim 1, where step (2) is present and step (2) comprises heating at a temperature of up to 200° C. for 1 to 30 minutes to partially cure the film.

14. The method of claim 1, where step (4) is performed by heating at a temperature of 120° C. to 250° C. for 30 seconds to 120 minutes.

15. The method of claim 1, where step (5) comprises thinning, electroplating, metallization, plasma treatment, photoresist processing, dielectric coating, and a combination thereof.

16. The method of claim 1, where step (6) is performed by heating the product of step (5) at a temperature ranging from 260° C. to 450° C. for a time ranging from 0.1 hour to 2 hours.

17. The method of claim 1, where optional step (7) is present and is performed by immersing the semiconductor wafer in a solvent and/or an etching solution.

18. The method of claim 1, where step (8) is performed by hand or mechanical means.

19. The method of claim 1, where optional step (9) is present and is performed by immersing the semiconductor wafer in a solvent and/or an etching solution.

* * * * *